(12) United States Patent
Lin

(10) Patent No.: US 8,421,158 B2
(45) Date of Patent: Apr. 16, 2013

(54) CHIP STRUCTURE WITH A PASSIVE DEVICE AND METHOD FOR FORMING THE SAME

(75) Inventor: Mou-Shiung Lin, Hsinchu (TW)

(73) Assignee: Megica Corporation, Hsinchu (TW)

( * ) Notice: Subject to any disclaimer, the term of this patent is extended or adjusted under 35 U.S.C. 154(b) by 655 days.

(21) Appl. No.: 10/710,596

(22) Filed: Jul. 23, 2004

(65) Prior Publication Data

US 2004/0245580 A1    Dec. 9, 2004

Related U.S. Application Data

(60) Continuation-in-part of application No. 10/445,558, filed on May 27, 2003, which is a continuation-in-part of application No. 10/303,451, filed on Nov. 25, 2002, now Pat. No. 6,897,507, which is a continuation of application No. 10/156,590, filed on May 28, 2002, now Pat. No. 6,489,647, which is a division of application No. 09/970,005, filed on Oct. 3, 2001, now Pat. No. 6,455,885, which is a division of application No. 09/721,722, filed on Nov. 27, 2000, now Pat. No. 6,303,423, which is a continuation-in-part of application No. 09/637,926, filed on Aug. 14, 2000, now abandoned, which is a continuation-in-part of application No. 09/251,183, filed on Feb. 17, 1999, now Pat. No. 6,383,916, which is a continuation-in-part of application No. 09/216,791, filed on Dec. 21, 1998, now abandoned.

(30) Foreign Application Priority Data

Jul. 23, 2003  (TW) ................................. 92120050 A

(51) Int. Cl.
*H01L 27/08* (2006.01)

(52) U.S. Cl.
USPC .................... 257/379; 257/536; 257/E27.024

(58) Field of Classification Search .......... 257/358–359, 257/379–380, E23.011
See application file for complete search history.

(56) References Cited

U.S. PATENT DOCUMENTS

| 4,021,838 A | 5/1977 | Warwick |
| 4,685,998 A | 8/1987 | Quinn |

(Continued)

FOREIGN PATENT DOCUMENTS

| EP | 0683519 | 11/1995 |
| EP | 0884783 | 12/1998 |

(Continued)

OTHER PUBLICATIONS

Joachim N. Burghartz et al., "Spiral Inductors and Transmission Lines in Silicon Technology Using Copper-Damescene Interconnects and Low-Loss Substrates", Theory and Techniques, vol. 45, No. 10, Oct. 1997, pp. 1961-1968.

(Continued)

*Primary Examiner* — Colleen Matthews
(74) *Attorney, Agent, or Firm* — Seyfarth Shaw LLP

(57) ABSTRACT

The present invention provides a method for forming a chip structure with a resistor. A semiconductor substrate is provided and has a surface. A plurality of electronic devices and a resistor is formed on the surface of the semiconductor substrate. A plurality of dielectric layers and a plurality of circuit layers are formed over the semiconductor substrate. The dielectric layers are stacked over the semiconductor substrate and have a plurality of via holes. Each of the circuit layers is disposed on corresponding one of the dielectric layers respectively, wherein the circuit layers are electrically connected with each other through the via holes and are electrically connected to the electronic devices. A passivation layer is formed over the dielectric layers and the circuit layers. A circuit line is formed over the passivation layer, wherein the circuit line passes through the passivation layer and is electrically connected to the resistor.

63 Claims, 7 Drawing Sheets

U.S. PATENT DOCUMENTS

| | | | |
|---|---|---|---|
| 4,885,841 A | 12/1989 | McNabb | |
| 4,899,360 A | 2/1990 | Fujita | |
| 4,992,847 A | 2/1991 | Tuckerman | |
| 5,047,830 A | 9/1991 | Grabbe | |
| 5,055,907 A | 10/1991 | Jacobs | |
| 5,095,402 A | 3/1992 | Hernandez | |
| 5,106,461 A | 4/1992 | Volfson | |
| 5,212,403 A | 5/1993 | Nakanishi | |
| 5,226,232 A | 7/1993 | Boyd | |
| 5,328,553 A * | 7/1994 | Poon | 438/633 |
| 5,370,766 A | 12/1994 | Desaigoudar | |
| 5,372,967 A | 12/1994 | Sundaram et al. | |
| 5,416,356 A | 5/1995 | Staudinger et al. | |
| 5,446,311 A | 8/1995 | Ewen | |
| 5,455,064 A | 10/1995 | Chou | |
| 5,455,885 A | 10/1995 | Cameron | |
| 5,465,879 A | 11/1995 | La | |
| 5,478,773 A | 12/1995 | Dow et al. | |
| 5,485,038 A | 1/1996 | Licari | |
| 5,501,006 A | 3/1996 | Gehman, Jr. | |
| 5,519,582 A | 5/1996 | Matsuzaki | |
| 5,527,998 A | 6/1996 | Anderson | |
| 5,539,241 A | 7/1996 | Abidi | |
| 5,608,262 A | 3/1997 | Degani | |
| 5,629,240 A | 5/1997 | Malladi | |
| 5,635,767 A | 6/1997 | Wenzel | |
| 5,656,849 A | 8/1997 | Burghartz | |
| 5,686,764 A | 11/1997 | Fulcher | |
| 5,712,184 A | 1/1998 | Kaiser | |
| 5,742,100 A | 4/1998 | Schroeder | |
| 5,763,108 A | 6/1998 | Chang et al. | |
| 5,767,564 A | 6/1998 | Kunimatsu | |
| 5,770,472 A | 6/1998 | Zhou | |
| 5,789,303 A | 8/1998 | Leung et al. | |
| 5,827,776 A | 10/1998 | Bandyopadhyay | |
| 5,834,844 A | 11/1998 | Akagawa | |
| 5,842,626 A | 12/1998 | Bhansali | |
| 5,874,770 A | 2/1999 | Saia | |
| 5,883,422 A | 3/1999 | Anand | |
| 5,884,990 A | 3/1999 | Burghartz | |
| 5,886,393 A | 3/1999 | Merrill | |
| 5,915,169 A | 6/1999 | Heo | |
| 5,930,031 A | 7/1999 | Zhou | |
| 5,949,654 A | 9/1999 | Fukuoka | |
| 5,969,422 A | 10/1999 | Ting | |
| 5,969,424 A | 10/1999 | Matsuki | |
| 5,972,734 A * | 10/1999 | Carichner et al. | 438/106 |
| 6,002,161 A | 12/1999 | Yamazaki | |
| 6,004,831 A | 12/1999 | Yamazaki | |
| 6,008,102 A | 12/1999 | Alford et al. | |
| 6,023,407 A | 2/2000 | Farooq | |
| 6,025,261 A | 2/2000 | Farrar | |
| 6,031,445 A | 2/2000 | Marty | |
| 6,040,226 A | 3/2000 | Wojnarowski | |
| 6,043,430 A | 3/2000 | Chun | |
| 6,097,080 A | 8/2000 | Nakanishi | |
| 6,133,079 A | 10/2000 | Zhu | |
| 6,147,857 A | 11/2000 | Worley | |
| 6,168,854 B1 | 1/2001 | Gibbs | |
| 6,169,030 B1 | 1/2001 | Naik | |
| 6,169,319 B1 | 1/2001 | Malinovich | |
| 6,174,803 B1 | 1/2001 | Harvey | |
| 6,180,445 B1 | 1/2001 | Tsai | |
| 6,184,589 B1 | 2/2001 | Budnaitis | |
| 6,191,468 B1 | 2/2001 | Forbes | |
| 6,221,727 B1 | 4/2001 | Chan | |
| 6,228,447 B1 | 5/2001 | Suzuki | |
| 6,236,101 B1 * | 5/2001 | Erdeljac et al. | 257/531 |
| 6,236,103 B1 | 5/2001 | Bernstein | |
| 6,242,791 B1 | 6/2001 | Jou | |
| 6,245,594 B1 | 6/2001 | Wu | |
| 6,249,764 B1 | 6/2001 | Kamae | |
| 6,255,714 B1 | 7/2001 | Kossives | |
| 6,259,593 B1 | 7/2001 | Moriwaki | |
| 6,261,944 B1 * | 7/2001 | Mehta et al. | 438/624 |
| 6,261,994 B1 | 7/2001 | Bourdelais | |
| 6,268,225 B1 | 7/2001 | Chen | |
| 6,272,736 B1 | 8/2001 | Lee | 29/620 |
| 6,278,264 B1 | 8/2001 | Burstein et al. | |
| 6,288,447 B1 | 9/2001 | Amishiro | |
| 6,294,834 B1 | 9/2001 | Yeh | |
| 6,303,423 B1 | 10/2001 | Lin | |
| 6,365,480 B1 | 4/2002 | Huppert et al. | 438/381 |
| 6,365,498 B1 | 4/2002 | Chu et al. | |
| 6,383,916 B1 | 5/2002 | Lin | |
| 6,399,178 B1 | 6/2002 | Chung | |
| 6,399,997 B1 | 6/2002 | Lin | |
| 6,404,615 B1 | 6/2002 | Wijeyesekera | |
| 6,410,435 B1 | 6/2002 | Ryan | |
| 6,416,356 B1 | 7/2002 | Hutchins | |
| 6,417,089 B1 | 7/2002 | Kim | |
| 6,420,773 B1 | 7/2002 | Liou | |
| 6,424,034 B1 | 7/2002 | Ahn et al. | |
| 6,429,764 B1 | 8/2002 | Karam | |
| 6,440,750 B1 | 8/2002 | Feygenson | |
| 6,441,715 B1 | 8/2002 | Johnson | |
| 6,455,885 B1 | 9/2002 | Lin | |
| 6,455,915 B1 | 9/2002 | Wong | |
| 6,458,670 B2 | 10/2002 | Nagasaka | |
| 6,459,135 B1 | 10/2002 | Basteres et al. | |
| 6,475,904 B2 | 11/2002 | Okoroanyanwu | |
| 6,478,773 B1 | 11/2002 | Gandhi | |
| 6,479,341 B1 | 11/2002 | Lu | |
| 6,486,530 B1 * | 11/2002 | Sasagawa et al. | 257/532 |
| 6,495,442 B1 * | 12/2002 | Lin et al. | 438/618 |
| 6,500,724 B1 | 12/2002 | Zurcher | |
| 6,501,169 B1 | 12/2002 | Aoki et al. | |
| 6,501,185 B1 | 12/2002 | Chow | |
| 6,545,354 B1 | 4/2003 | Aoki et al. | |
| 6,559,409 B1 | 5/2003 | Cadet | |
| 6,559,528 B2 | 5/2003 | Watase et al. | |
| 6,570,247 B1 | 5/2003 | Eiles | |
| 6,586,309 B1 | 7/2003 | Yeo | |
| 6,644,536 B2 | 11/2003 | Ratificar | |
| 6,649,509 B1 | 11/2003 | Lin | |
| 6,673,690 B2 | 1/2004 | Chuang | |
| 6,700,162 B2 | 3/2004 | Lin | |
| 6,710,433 B2 | 3/2004 | Megahed | |
| 6,756,664 B2 | 6/2004 | Yang | |
| 6,764,939 B1 | 7/2004 | Yoshitaka | |
| 6,841,872 B1 | 1/2005 | Ha | |
| 6,847,066 B2 | 1/2005 | Tahara et al. | |
| 6,852,616 B2 | 2/2005 | Sahara et al. | |
| 6,897,507 B2 | 5/2005 | Lin | |
| 6,903,459 B2 | 6/2005 | Nakatani | |
| 6,914,331 B2 | 7/2005 | Shimoishizaka et al. | |
| 6,921,980 B2 | 7/2005 | Nakanishi | |
| 7,012,339 B2 | 3/2006 | Terui | |
| 7,087,927 B1 | 8/2006 | Weaver | |
| 2001/0017417 A1 | 8/2001 | Kuroda | |
| 2001/0019168 A1 | 9/2001 | Willer | |
| 2001/0028098 A1 | 10/2001 | Liou | |
| 2001/0035586 A1 | 11/2001 | Nakamura | |
| 2002/0017730 A1 | 2/2002 | Tahara et al. | |
| 2002/0050626 A1 | 5/2002 | Onuma | |
| 2002/0064922 A1 | 5/2002 | Lin | |
| 2003/0037959 A1 | 2/2003 | Master | |
| 2003/0038331 A1 | 2/2003 | Aoki et al. | |
| 2003/0042587 A1 | 3/2003 | Lee | |
| 2003/0071326 A1 | 4/2003 | Lin | |
| 2003/0076209 A1 | 4/2003 | Tsai | |
| 2003/0121958 A1 | 7/2003 | Ratificar | |
| 2003/0155570 A1 * | 8/2003 | Leidy | 257/48 |
| 2003/0160307 A1 | 8/2003 | Gibson | |
| 2003/0183332 A1 * | 10/2003 | Simila | 156/291 |
| 2003/0197283 A1 | 10/2003 | Choi | |
| 2003/0222295 A1 | 12/2003 | Lin | |
| 2003/0224613 A1 | 12/2003 | Ramanathan | |
| 2004/0016948 A1 | 1/2004 | Lin | |
| 2004/0029404 A1 | 2/2004 | Lin | |
| 2004/0094841 A1 | 5/2004 | Matsuzaki et al. | |
| 2004/0166661 A1 | 8/2004 | Lei | |
| 2004/0183209 A1 | 9/2004 | Lin | |
| 2004/0245580 A1 | 12/2004 | Lin | |
| 2005/0170634 A1 | 8/2005 | Lin | |
| 2005/0250255 A1 | 11/2005 | Chen | |
| 2005/0275094 A1 | 12/2005 | Berry | |

| | | | |
|---|---|---|---|
| 2007/0108551 | A1 | 5/2007 | Lin |
| 2007/0181970 | A1 | 8/2007 | Lin |
| 2007/0202684 | A1 | 8/2007 | Lin |
| 2007/0202685 | A1 | 8/2007 | Lin |
| 2008/0001302 | A1 | 1/2008 | Lin |
| 2008/0050909 | A1 | 2/2008 | Lin |

FOREIGN PATENT DOCUMENTS

| | | |
|---|---|---|
| EP | 0986106 | 3/2000 |
| EP | 0999580 | 5/2000 |
| FR | 2793943 | 7/2001 |
| JP | 03-019358 | 1/1991 |
| JP | 2000-022085 | 1/2000 |
| TW | 457624 | 10/2001 |
| TW | 466745 | 12/2001 |
| TW | 466764 | 12/2001 |
| TW | 489346 | 6/2002 |
| TW | 497250 | 8/2002 |
| TW | 503496 | 9/2002 |
| TW | 515081 | 12/2002 |
| TW | 517361 | 1/2003 |
| TW | 546800 | 8/2003 |
| TW | 232078 | 5/2005 |
| WO | WO 94/17558 | 8/1994 |
| WO | WO 00/04577 | 1/2000 |

OTHER PUBLICATIONS

Seong-Mo Yim, et al., "The Effects of Ground Shield on Spiral Inductors Fabricated in a Silicon Bipolar Technology", IEEE, Sep. 24, 2000, pp. 157-160.
Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.
Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.
Gao, X. et al. "An improved electrostatic discharge protection structure for reducing triggering voltage and parasitic capacitance," Solid-State Electronics, 27 (2003), pp. 1105-1110.
Yeoh, A. et al. "Copper Die Bumps (First Level Interconnect) and Low-K Dielectrics in 65nm High Volume Manufacturing," Electronic Components and Technology Conference (2006) pp. 1611-1615.
Hu, C-K. et al. "Copper-Polyimide Wiring Technology for VLSI Circuits," Materials Research Society Symposium Proceedings VLSI V (1990) pp. 369-373.
Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects on Power Supply Clamps," Proceedings of the 6th International Sympoisum on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.
Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution," (Brochure) (Feb. 6, 2004) pp. 1-3.
Lin, M.S. "Post Passivation Technology™—MEGIC® Way to System Solutions,". Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

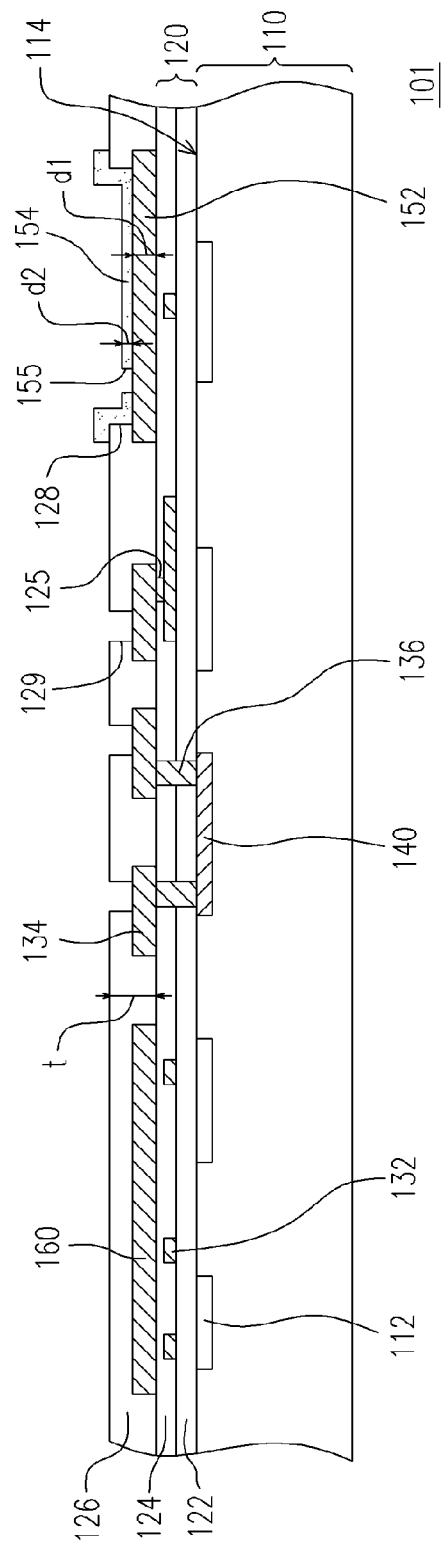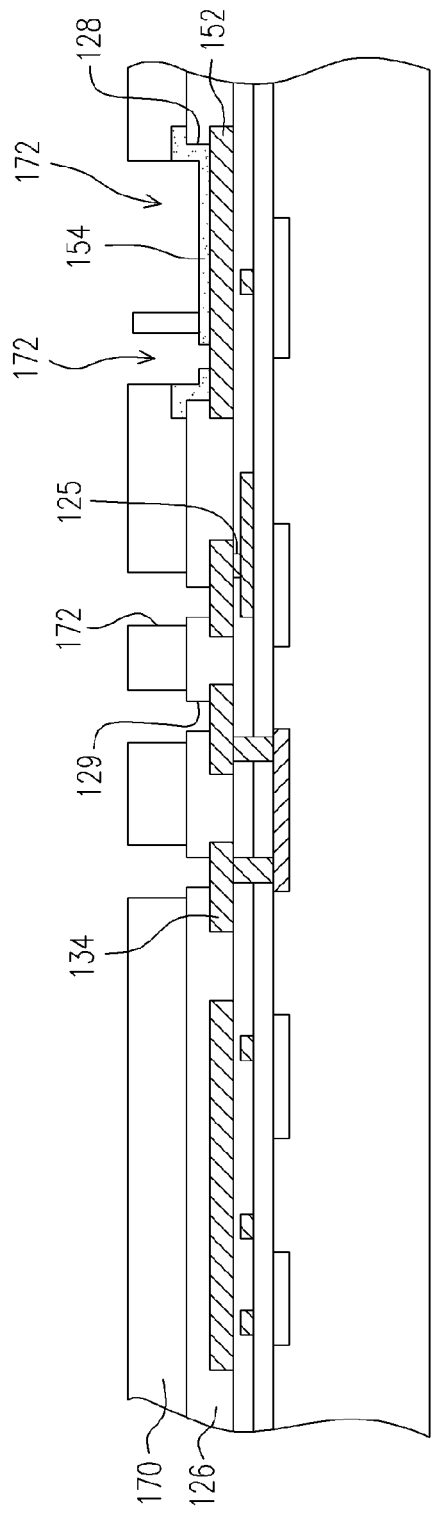

CHIP STRUCTURE WITH A PASSIVE DEVICE AND METHOD FOR FORMING THE SAME

CROSS REFERENCE TO RELATED APPLICATIONS

This application claims the priority benefit of Taiwan application serial no. 92120050, filed Jul. 23, 2003. This application is a continuation-in-part of application Ser. No. 10/445,558, filed on May 27, 2003, which is a continuation-in-part of 10/303,451, now U.S. Pat. No. 6,897,507, filed on Nov. 25, 2002, which is a continuation of Ser. No. 10/156,590, now U.S. Pat. No. 6,489,647, filed on May 28, 2002, which is a division of Ser. No. 09/970,005, now U.S. Pat. No. 6,455,885, filed on Oct. 3, 2001, which is a division of Ser. No. 09/731,722, now U.S. Pat. No. 6,303,423, filed on Nov. 27, 2000, which is a continuation-in-part of application Ser. No. 09/637,926, filed on Aug. 14, 2000 now abandoned, which is a continuation-in-part of Ser. No. 09/251,183, now U.S. Pat. No. 6,383,916, filed on Feb. 17, 1999, which is a continuation-in-part of application Ser. No. 09/216,791, filed on Dec. 21, 1998 now abandoned.

BACKGROUND OF INVENTION

1. Field of the Invention

The invention relates to a chip structure with a passive device and a method for forming the same. More particularly, the invention relates to a chip structure having a passive device with high performance and high quality and a method for forming the same.

2. Description of the Related Art

Information products are playing important roles in today's competitive society. With the evolution of the information products and the introduction of the concept of integrating various circuit designs, the latest single chip, generally, provides more functions than the former one. After integration, the dimension of the circuits is reduced and the majority of the signals are being transmitted within a single chip. As a result, paths for transmitting signals are reduced and the performance of the chip is improved.

In general, a circuit often works with some passive devices. Conventional passive devices are positioned inside a chip or on a printed circuit board. In the first case, as passive devices are formed inside the chip, they are formed in or over a semiconductor substrate during the formation of electronic devices, whose methods comprise a physical-vapor-deposition (PVD) process, a chemical-vapor-deposition (CVD) process, and a photolithography-etching process. In the second case, as the passive devices are being placed on a printed circuit board, they are bonded onto the printed circuit board using surface-mounting technology (SMT). In the latest advancement of the technology, the concept related to placing passive devices over an IC passivation layer is presented in U.S. Pat. No. 6,303,423, U.S. Pat. No. 6,455,885, U.S. Pat. No. 6,489,647, U.S. Pat. No. 6,489,656, and U.S. Pat. No. 6,515,369.

Wherever the passive devices are disposed, both merits and demerits exist. When the passive devices are formed in the chip, a resistor with high quality and high accuracy can be formed using the concurrent semiconductor process. A capacitor having a dielectric layer that is as thin as a few angstroms can be formed using a chemical-vapor-deposition process and thus the capacitor with high accuracy can be provided. However, in the case that an inductor is formed in a chip, an eddy current occurs in the silicon semiconductor substrate, due to the electromagnetic field generated by the inductors, which dramatically reduces the quality factor of the inductor (Q value). The parasitic capacitance between the inductor and the underlying silicon semiconductor substrate induces a serious negative impact on a LC circuit with the inductors. Furthermore, the electromagnetic field generated by the inductors would adversely impact the performance of other electronic devices that are located in the vicinity of the inductors.

When the passive devices are formed on the passivation layer of the chip, the process is generally performed in a bump fab. The bump fab can not provide a process with high image resolution whereby a resistor and a capacitor are formed and therefore the dimension of the resistor and the capacitor is inaccurate. The resistance value of the resistor and the capacitance value of the capacitor can not be controlled within a small tolerance. Generally, a bump fab does not have a capability of forming a film using a chemical-vapor-deposition process and thus a thin dielectric layer can not be formed for the capacitor. As a result, the capacitor with large capacitance value can not be formed in a bump fab.

SUMMARY OF INVENTION

Therefore, one objective of the present invention is to provide a chip structure with passive devices and a method for forming the passive devices, namely, resisters, capacitors and inductors with high accuracy in the chip structure, using implements in a wafer fab and in a bump fab together and combining the individual merits of the fabricating processes performed in a wafer fab and in a bump fab.

The present invention is directed to a method for forming a chip structure including at least a resistor. A plurality of electronic devices and a resistor are formed in a surface layer of a semiconductor substrate. A plurality of dielectric layers and a plurality of circuit layers are formed over the semiconductor substrate. The dielectric layers are stacked over the semiconductor substrate and have a plurality of via holes. Each of the circuit layers is disposed on corresponding one of the dielectric layers respectively, wherein the circuit layers are electrically connected with each other through the via holes and are electrically connected to the electronic devices. A passivation layer is formed over the dielectric layers and the circuit layers. A circuit line is formed over the passivation layer, wherein the circuit line passes through the passivation layer and is electrically connected to the resistor.

The resistor is not limited to being formed on the semiconductor substrate. Alternatively, a resistor may be formed on one of the dielectric layers or formed on the passivation layer, wherein the resistor is electrically connected with the circuit line positioned over the passivation layer.

Because the resolution of the semiconductor process performed in the concurrent wafer fab can be reduced up to 0.1 microns, the resistor can be formed with high accuracy. Therefore, the resistance value of the resistor can be precisely controlled by using the semiconductor process.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic cross-sectional view showing a method for forming a chip in a wafer fab according to a first embodiment of the present invention.

FIGS. 2-4 are schematic cross-sectional views showing a method for forming a chip structure in a bump fab according to a first embodiment of the present invention.

DETAILED DESCRIPTION

First Embodiment

Figure 3:
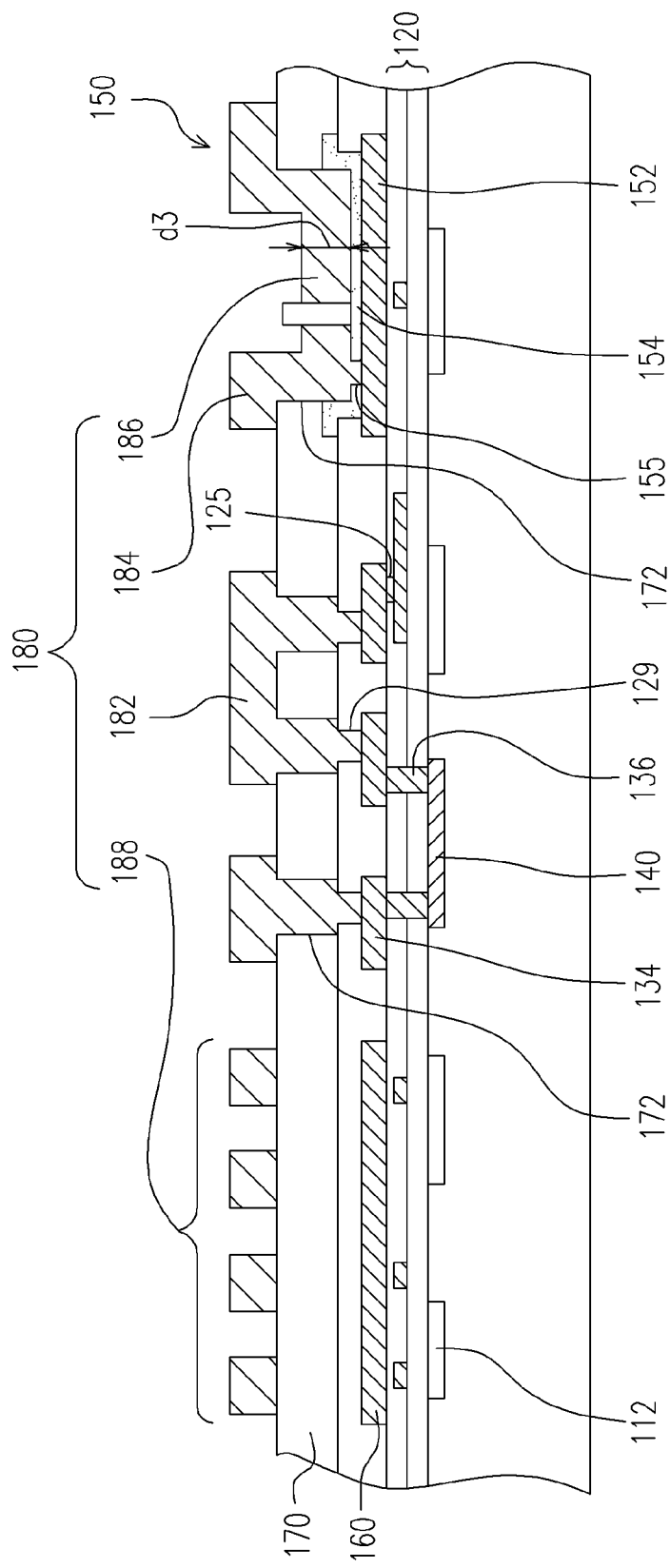

FIG. 1 is a schematic cross-sectional view showing a method for forming a chip in a wafer fab according to a first embodiment of the present invention. Referring to FIG. 1, in a semiconductor fab, multiple electronic devices 112, such as transistors or MOS devices, are formed in a surface layer 114 of the semiconductor substrate 110, wherein the semiconductor substrate 110 is, for example, silicon. During forming the electronic devices 112, a resistor 140 is formed by doping dopants, such as boron, phosphorous, arsenic or gallium, into the surface layer through the surface 114 of the semiconductor substrate 110. The resistor 140 is made of, for example, a material of constituting a N well, a P well, a $N^+$ diffusion region or a $P^+$ diffusion region.

Multiple dielectric layers 122 and 124 are deposited on the semiconductor substrate 110 and have a plurality of via holes 125 (only shown one of them). Multiple circuit layers 132 and 134 are disposed on the dielectric layers 122 and 124, respectively. The circuit layers 132 and 134 are electrically connected with each other through the via holes 125 and are electrically connected to the electronic devices 112. The circuit layers 132 and 134 are formed, for example, by depositing aluminum or an aluminum alloy using a PVD process or by depositing copper or a copper alloy using an electroplating process and a damascene process.

During forming the circuit layer 134, an electrode 152 of a capacitor is formed on the dielectric layer 124 that is the one farthest away from the semiconductor substrate 110. The electrode 152 is formed, for example, by depositing aluminum or an aluminum alloy using a PVD process or by depositing copper or a copper alloy using an electroplating process and a damascene process. The electrode 152 has a thickness d1, for example, ranging from 0.05 microns to 2 microns.

During forming the circuit layer 134, an electromagnetic-field shielding layer 160 is formed on the dielectric layer 124 that is the one farthest away from the semiconductor substrate 110. The electrode 152 is formed, for example, by depositing aluminum or an aluminum alloy using a PVD process or by depositing copper or a copper alloy using an electroplating process and a damascene process. Preferably, The electrode 152 and the electromagnetic-field shielding layer 160 has the same material, such as aluminum, copper, an aluminum alloy and a copper alloy. The electrode 152 and the electromagnetic-field shielding layer 160 have the same thickness, for example, ranging from 0.05 microns to 2 microns.

Afterwards, a passivation layer 126 is formed over the dielectric layers 122 and 124 and the circuit layers 132 and 134, covering the electrode 152 and the electromagnetic-field shielding layer 160. The passivation layer 126 has a thickness t, for example, larger than 0.35 microns. It should be noted that the passivation layer 126 should be thick enough to prevent moisture, impurities, mobile ions or transitional metal elements from penetrating therethrough. The passivation layer 126 has openings 128 and 129 exposing the electrode 152 and the circuit layer 134. The openings 129 have a width, for example, ranging from 0.1 microns to 20 microns. The passivation layer 126 can be a silicon-dioxide layer, a silicon-nitride layer, a phosphosilicate-glass (PSG) layer, a silicon oxynitride layer or a composite structure by depositing some or all of the above-mentioned dielectric layers.

Next, a capacitor dielectric-layer 154 is formed on the electrode 152 and has a thickness, for example, ranging from 0.005 microns to 2 microns.

The capacitor dielectric-layer 154 can be formed using the following methods:

First Method: the capacitor dielectric-layer 154 is formed by depositing tetraethylorthosilicate (TEOS), silicon dioxide, silicon nitride, silicon oxynitride, tantalum oxide ($Ta_2O_5$), strontium titanate ($SrTiO_3$) or barium-strontium-titanate (BST) using a CVD process.

Second Method: the capacitor dielectric-layer 154 is formed by depositing tantalum oxide ($Ta_2O_5$), strontium titanate ($SrTiO_3$) or barium-strontium-titanate (BST) using a PVD process.

The capacitor dielectric-layer 154 can be a single layer made of one of the above-mentioned materials or a composite structure formed by depositing some of the above-mentioned materials. After forming the capacitor dielectric-layer 154, photographic and etching processes are performed to form an opening 155 passing through the capacitor dielectric-layer 154 and exposing the electrode 152.

Figure 4:
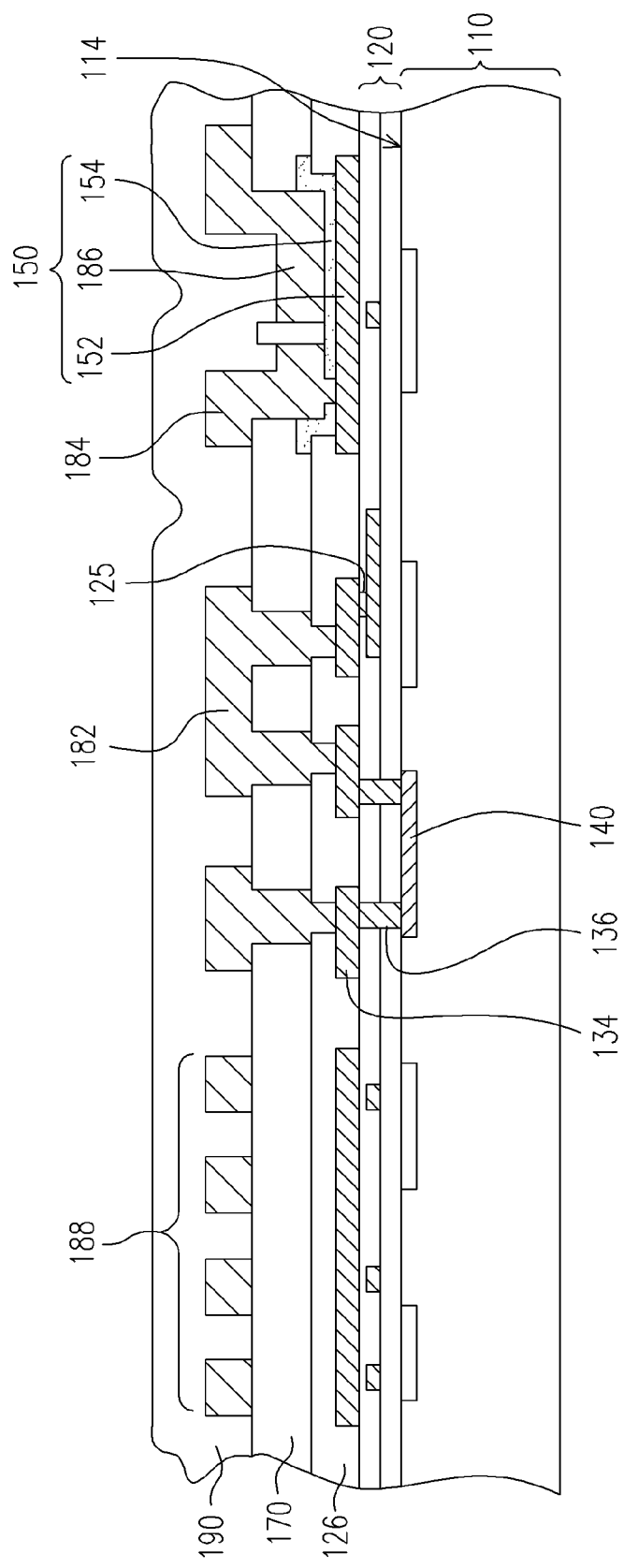

After the capacitor dielectric-layer 154 is formed, the semi-finished chip structure 101 can be transmitted from a wafer fab to a bump fab or a packing house for further downstream processing. FIGS. 2-4 are schematic cross-sectional views showing a method for forming a chip structure in a bump fab according to a first embodiment of the present invention. Referring to FIG. 2, after the semi-finished chip structure 101 is transmitted to a bump fab, an insulation layer 170 is formed on the passivation layer 126. The insulation layer 170 has multiple openings 172 substantially aligned with the openings 128 and 129 of the passivation layer 126 and exposing the circuit layer 134, the capacitor dielectric-layer 154 and the electrode 152. The insulation layer 170 is made of polyimide (PI), benzocyclobutene (BCB), porous dielectric material, parylene, elastomer, or low k dielectric material, for example.

Referring to FIG. 3, for example, using a sputter process and a electroplating process, a metal layer 180 is formed on the insulation layer 170 and is filled into the openings 172 of the insulation layer 170. The metal layer 180 is a composite structure by depositing some of those selected from the group consisting of a titanium-tungsten-alloy layer, a titanium layer, a titanium-nitride layer, a tantalum layer, a tantalum-nitride layer, a chromium layer, a copper layer, a chromium-copper-alloy layer, a nickel layer and a gold layer. Alternatively, the metal layer 180 can be formed by depositing aluminum or an aluminum alloy using a sputter process.

The metal layer 180 includes circuit lines 182, 184, an electrode 186 of a capacitor and an inductor 188. The circuit line 182 passes through one of the openings 172 of the insulation layer 170 and one of the openings 129 of the passivation layer 126 and is electrically connected to the resistor 140 through the circuit layer 134 and the metal via 136. The circuit line 182 is, for example, a power bus, a ground bus or a signal transmission line. The circuit line 184 passes through one of the openings 172 of the insulation layer 170 and the openings 155 of the capacitor dielectric-layer 154 and is electrically connected to the electrode 152. The electrode 186 is positioned on the capacitor dielectric-layer 154 and has a thickness, for example, ranging from 0.6 microns to 50 microns. A capacitor 150 is composed of the electrodes 186, 152 and the capacitor dielectric-layer 154 located between the electrodes 186, 152. The inductor 188 is positioned on the insulation layer 170. The inductor 180 can be formed in a shape of a coil, a solenoid or a toroid and can be referred to U.S. Pat. No. 6,303,423, which is hereby incorporated by reference in its entirety. The electromagnetic-field shielding layer 160 is positioned under the inductor 188; in other words, the electromagnetic-field shielding layer 160 is positioned between the inductor 188 and the electronic devices 112. The electromagnetic field generated by the inductor 188 is shielded by the electromagnetic-field shielding layer 160 and thereby dramatically reduces the interference with the electronic devices 112.

The top electrode 186, the inductor 188 and circuit lines 182, 184 are completed at the same time. The electrode 186, the inductor 188 and circuit lines 182, 184 can be formed, from bottom to top, from a titanium layer and a copper layer or a titanium layer, a copper layer and a nickel layer or a titanium layer, a copper layer, a nickel layer and a gold layer, or a titanium-tungsten-alloy layer and a gold layer, or a chromium layer, a chromium-copper-alloy layer and a copper layer, or a chromium layer, a chromium-copper-alloy layer, a copper layer and a nickel layer.

Thereafter, referring to FIG. 4, an insulation layer 190 is formed on the insulation layer 170, for example, using a spin-coating process. The insulation layer 190 covers the electrode 186, the inductor 188 and the circuit lines 182, 184. The insulation layer 190 is made of polyimide (PI), benzocyclobutene (BCB), porous dielectric material, parylene, elastomer or low k dielectric material, for example.

In accordance with the p resent invention, because the image resolution of the semiconductor process performed in a wafer fab can be minimized to 0.1 microns, the resistor 140 formed on the surface 114 of the semiconductor substrate 110 has high accuracy in dimension. Therefore, the resistor 140 has a resistance value with high accuracy.

The capacitor 150 is formed near the passivation layer 126 and thereby the semiconductor substrate 110 of the chip structure 100 has more areas for forming the electronic devices 112. Moreover, the passivation layer 126 has a large area where the capacitor 150 can be formed, so the capacitor 150 with high capacitance value can be formed in the chip structure 100 and the size of the capacitor 150 can be readily modified. Further, the capacitor 150 is disposed near the passivation layer 126 and the electronic devices are not formed on the passivation layer. The electronic devices 112 positioned on the semiconductor substrate 112 of the chip 100 being interfered by the charges stored in the capacitor 150 can be avoided. Moreover, using a semiconductor process to form the capacitor dielectric-layer 154, the thickness and the property of the capacitor dielectric-layer 154 can be accurately controlled. Consequently, the capacitance value of the capacitor 150 can also be accurately controlled.

In the present invention, the inductor 188 formed in a bump fab or packing house has a metal line with large thickness, so the resistance effect of the metal line of the inductor 188 is reduced. Moreover, the inductor 188 can be formed on the insulation layer 170 with large thickness and far away from the semiconductor substrate 110, so the eddy current in the silicon semiconductor substrate 110, caused by the electromagnetic field generated by the inductors 188, can be diminished. The inductor 188 with high accuracy and high efficiency can be formed in the chip structure 100.

Second Embodiment

Figure 5:
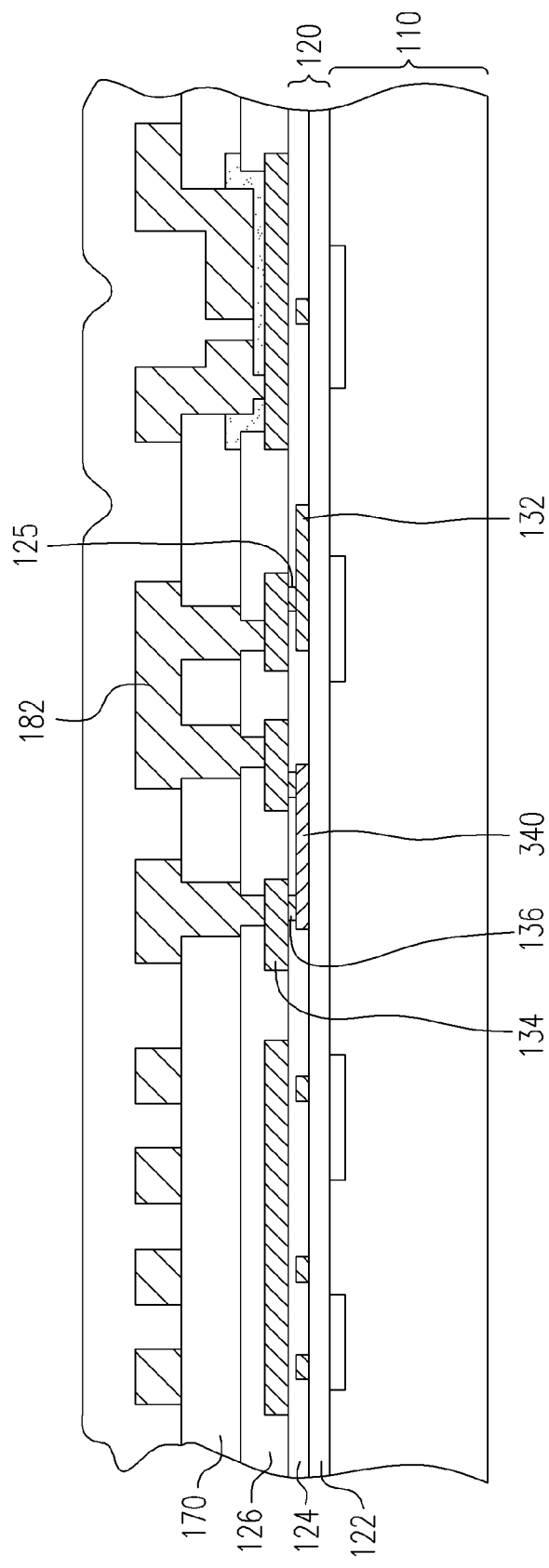
FIG. 5 and FIG. 6 are schematic cross-sectional views showing chip structures according to a second embodiment of the present invention.
Figure 6:
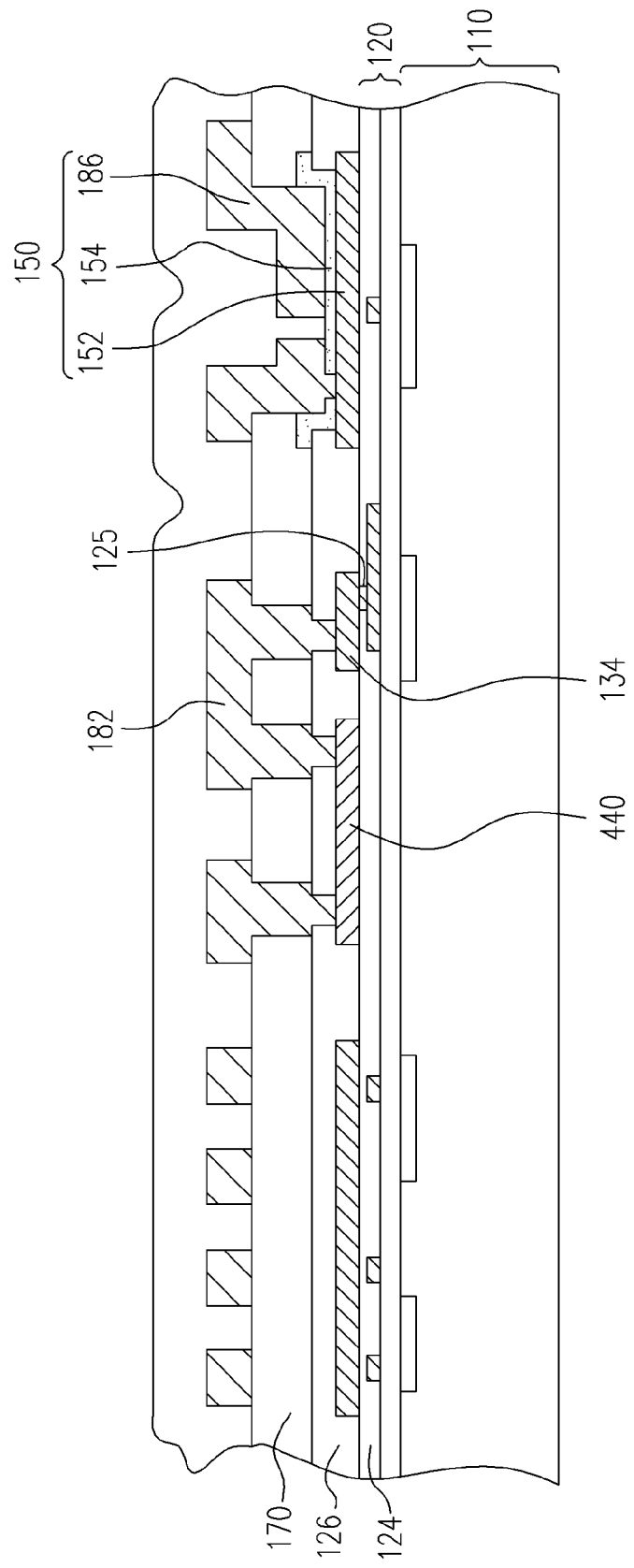

FIG. 5 and FIG. 6 are schematic cross-sectional views showing chip structures according to a second embodiment of the present invention. Wherever possible, the same reference numbers are used in the second embodiment and the first embodiment to refer to the same or like parts.

A resistor can be formed on one of the dielectric layers positioned between the semiconductor substrate and the passivation layer. For example, referring to FIG. 5, in a wafer fab, a resistor 340 is formed on the dielectric layer 122 positioned between the semiconductor substrate 110 and the passivation layer 126. The circuit line 182 passes through the insulation layer 170 and the passivation layer 126 and is electrically connected to the resistor 340 through the circuit layer 134 and the metal via 136. The resistor 340 can be formed by depositing polysilicon using a chemical-vapor-deposition (CVD) process. Moreover, the resistance value of the resistor 340 can be regulated by doping dopants, such as boron, phosphorous, arsenic or gallium, into polysilicon. The resistor 340 can be formed by depositing aluminum, copper, an aluminum alloy or a copper alloy using a physical-vapor-deposition (PVD) process. Besides, the resistor 340 can be formed by depositing tungsten using a CVD process. The resistance value of the resistor 340 can be adjusted by modifying its height, width and length. Generally, the resistor 340 has a width smaller than that of a trace of the circuit layer 132.

Referring to FIG. 6, in a wafer fab, a resistor 440 is formed on the dielectric layer 124. The circuit line 182 passes through the insulation layer 170 and the passivation layer 126 and is electrically connected to the resistor 440. The resistor 440 and the electrode 152 of the capacitor 150 are formed on the dielectric layer 124 that is the one farthest away from the semiconductor substrate 110. The passivation layer 126 covers the resistor 440 and the electrode 152 of the capacitor 150. Preferably, the resistor 440 and the electrode 152 of the capacitor 150 have the same material, such as aluminum, copper, an aluminum alloy or a copper alloy. Generally, the resistor 440 has a width smaller than that of a trace of the circuit layer 134.

Third Embodiment

Figure 7:
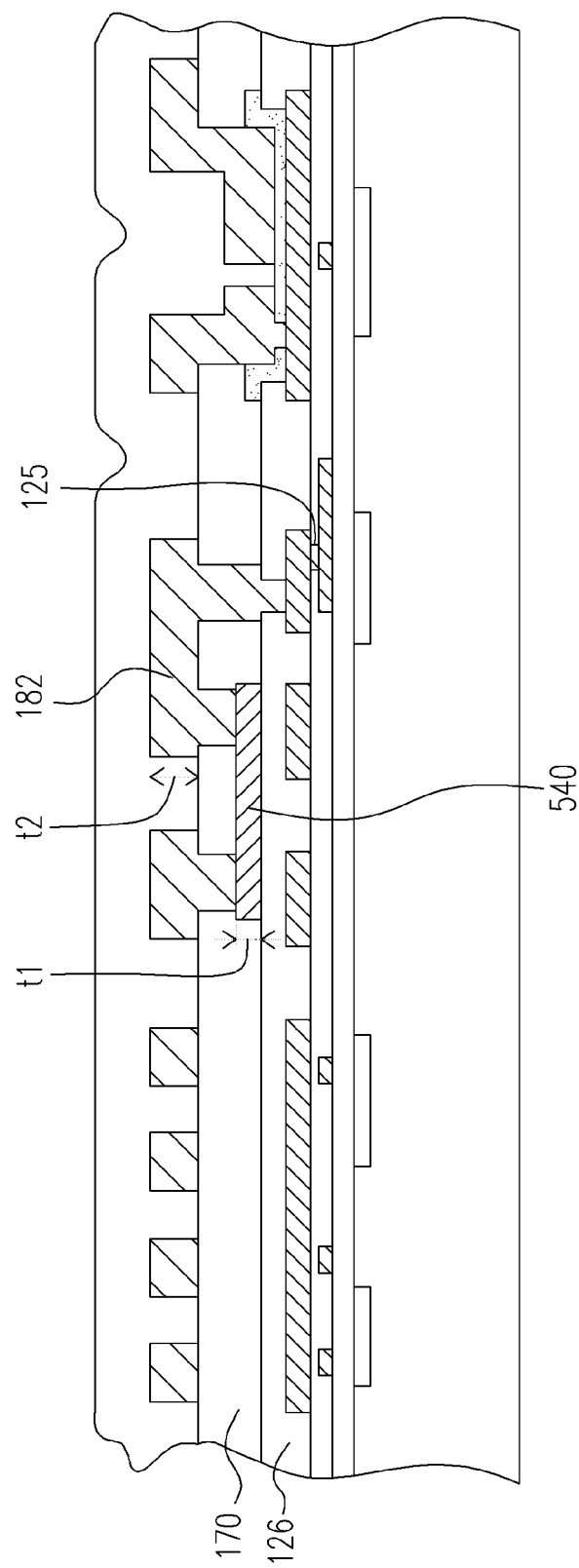
FIG. 7 is a schematic cross-sectional view showing a chip structure according to a third embodiment of the present invention.

FIG. 7 is a schematic cross-sectional view showing a chip structure according to a third embodiment of the present invention. Wherever possible, the same reference numbers are used in the third embodiment and the first embodiment to refer to the same or like parts.

Referring to FIG. 7, in a wafer fab, a resistor 540 is formed on the passivation layer 126. The circuit line 182 passes through the insulation layer 170 and is electrically connected to the resistor 540. The resistor 540 has a thickness t1 smaller than the thickness t2 of the circuit line 182 or has a width smaller than that of the circuit line 182. The resistor 540 can be formed by depositing aluminum, an aluminum alloy, copper, a copper alloy, a nickel-chromium alloy, a nickel-tin alloy, tantalum nitride, tantalum or tungsten using a vapor-deposition method or an electroplating method.

Forth Embodiment

Figure 8:
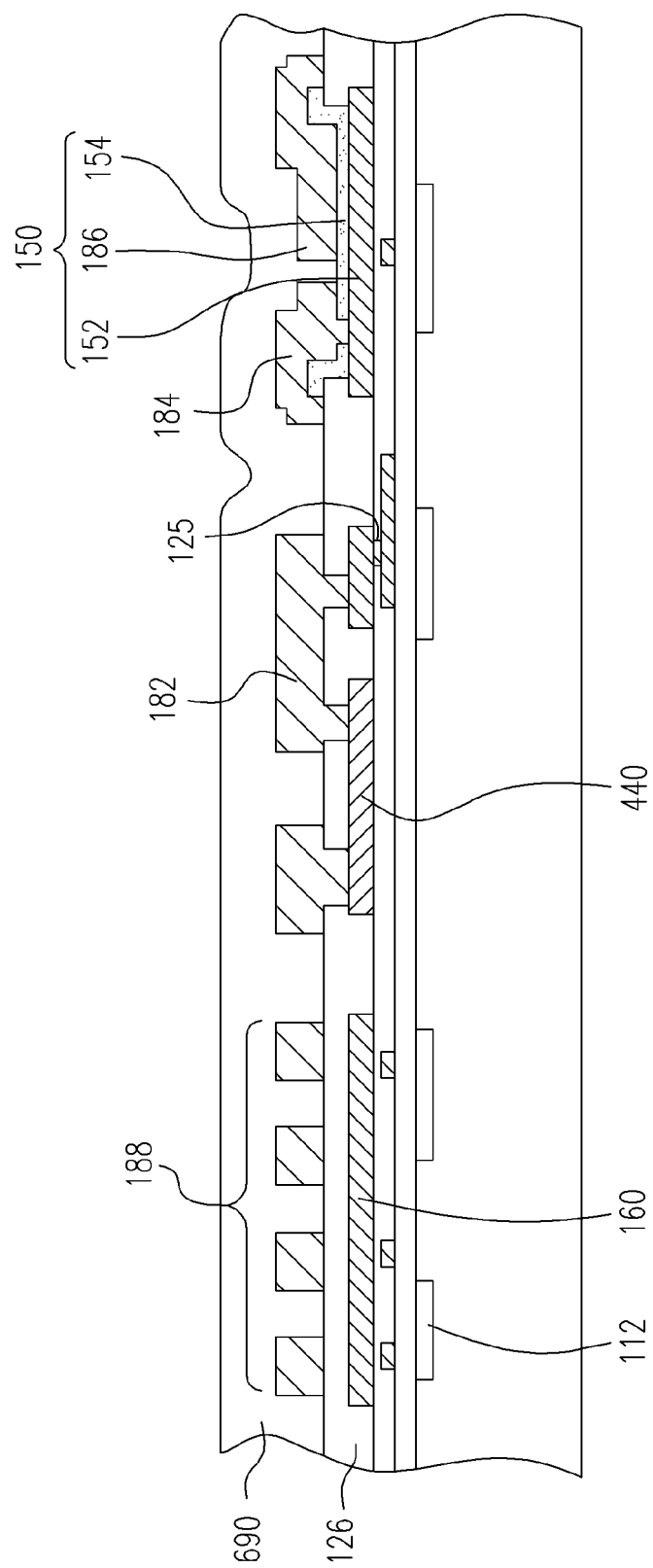
FIG. 8 is a schematic cross-sectional view showing a chip structure according to a forth embodiment of the present invention.

The above embodiments disclose that an inductor is formed on an insulation layer made of polyimide, for example, but the present invention is not limited to the above disclosure. FIG. 8 is a schematic cross-sectional view showing a chip structure according to a forth embodiment of the present invention. Wherever possible, the same reference numbers are used in the forth embodiment and the above embodiments to refer to the same or like parts.

Referring to FIG. 8, in a bump fab or packaging house, the inductor 188 and the circuit line 182 are formed directly on the passivation layer 126. The circuit line 182 passes through the passivation layer 126 and is electrically connected to the resistor 440. The inductor 188 is formed directly over the electromagnetic-field shielding layer 160. Therefore, the electromagnetic field generated by the inductor 188 is shielded by the electromagnetic-field shielding layer 160 and thereby dramatically reduces the interference with the electronic devices 112. An insulation layer 690 is formed on the passivation layer 126, for example, using a spin-coating process. The insulation layer 690 covers the electrode 186 of the capacitor 150, the inductor 188 and the circuit lines 182, 184. The insulation layer 690 is made of polyimide (PI), benzocyclobutene (BCB), porous dielectric material, parylene, elastomer or low k dielectric material, for example.

CONCLUSION

In the above embodiments, all of the chip structures includes an inductor, a capacitor and a resistor, but the present invention is not limited to the above embodiments. Other combinations is described as follows:

Combination I: A chip structure only has the resistors with the above-mentioned characteristics.

Combination II: A chip structure only has the capacitors with the above-mentioned characteristics.

Combination III: A chip structure only has the inductors with the above-mentioned characteristics.

Combination IV: A chip structure only has the resistors and the capacitors with the above-mentioned characteristics.

Combination V: A chip structure only has the inductors and the resistors with the above-mentioned characteristics.

Combination VI: A chip structure only has the inductors and the capacitors with the above-mentioned characteristics.

The present invention has the following advantages:

1. Because the image resolution of the semiconductor process performed in a wafer fab can be minimized to 0.1 microns, the resistor has high accuracy in dimension. Therefore, the resistor has a resistance value with high accuracy.

2. The capacitor is formed near the passivation layer and thereby the semiconductor substrate of the chip structure has more areas for forming the electronic devices. Moreover, the passivation layer has a large area where the capacitor can be formed, so the capacitor with high capacitance value can be formed in the chip structure and the size of the capacitor can be readily modified. Further, the capacitor is disposed near the passivation layer and the electronic devices are not formed on the passivation layer. The electronic devices positioned on the semiconductor substrate of the chip being interfered by the charges stored in the capacitor can be avoided. Moreover, using a semiconductor process to form the capacitor dielectric-layer, the thickness of the capacitor dielectric-layer can be accurately controlled. Consequently, the capacitance value of the capacitor can also be accurately controlled.

3. the inductor formed in a bump fab has a metal line with large thickness, so the resistance effect of the metal line of the inductor is reduced. Moreover, the inductor can be formed on the insulation layer with large thickness and far away from the semiconductor substrate, so the eddy current in the silicon semiconductor substrate, caused by the electromagnetic field generated by the inductors, can be diminished. The inductor with high accuracy and high efficiency can be formed in the chip structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A chip structure comprising:
a silicon substrate;
a resistor in said silicon substrate, wherein said resistor comprises silicon with a dopant;
a MOS device comprising a portion in said silicon substrate;
a metallization structure over said silicon substrate, wherein said metallization structure comprises a first metal layer and a second metal layer over said first metal layer;
a first dielectric layer between said first and second metal layers;
a passivation layer over said metallization structure and said first dielectric layer, wherein a first opening in said passivation layer is over a first contact point of a first metal interconnect of said metallization structure, and said first contact point is at a bottom of said first opening, wherein a second opening in said passivation layer is over a second contact point of a second metal interconnect of said metallization structure, and said second contact point is at a bottom of said second opening, and wherein a third opening in said passivation layer is over a third contact point of a third metal interconnect of said metallization structure, and said third contact point is at a bottom of said third opening, wherein said first contact point is connected to said third contact point through said resistor, wherein said passivation layer comprises a nitride layer; and
a third metal layer over said passivation layer and on said first, second and third contact points, wherein said first contact point is connected to said second contact point through a first portion of said third metal layer, wherein said third metal layer comprises a second portion connected to said first portion of said third metal layer through, in sequence, said third contact point, said resistor and said first contact point.

2. The chip structure as claimed in claim 1, wherein said dopant comprises boron.

3. The chip structure as claimed in claim 1, wherein said dopant comprises phosphorous.

4. The chip structure as claimed in claim 1, wherein said dopant comprises arsenic.

5. The chip structure as claimed in claim 1, wherein said dopant comprises gallium.

6. The chip structure as claimed in claim 1, wherein said third metal layer comprises a titanium-containing layer and a gold layer over said titanium-containing layer.

7. The chip structure as claimed in claim 1 further comprising a polymer layer on said passivation layer, wherein said third metal layer is further on said polymer layer.

8. The chip structure as claimed in claim 7, wherein said polymer layer comprises polyimide (PI).

9. The chip structure as claimed in claim 7, wherein said polymer layer comprises benzocyclobutene (BCB).

10. The chip structure as claimed in claim 1 further comprising a polymer layer on said third metal layer and over said passivation layer.

11. The chip structure as claimed in claim 10, wherein said polymer layer comprises polyimide (PI).

12. The chip structure as claimed in claim 10, wherein said polymer layer comprises benzocyclobutene (BCB).

13. The chip structure as claimed in claim 1 further comprising an inductor over said silicon substrate, wherein said inductor comprises a portion provided by said third metal layer.

14. The chip structure as claimed in claim 13, wherein said third metal layer comprises a copper layer.

15. The chip structure as claimed in claim 13, wherein said third metal layer comprises a gold layer.

16. The chip structure as claimed in claim 13, wherein said third metal layer comprises a titanium-containing layer and a copper layer over said titanium-containing layer.

17. The chip structure as claimed in claim 1 further comprising a capacitor over said silicon substrate, wherein said capacitor comprises a first electrode, provided by said metallization structure, over said silicon substrate, wherein a fourth opening in said passivation layer is over said first electrode, a second dielectric layer on said first electrode and in said fourth opening, and a second electrode, provided by said third metal layer, on said second dielectric layer and over said first electrode.

18. The chip structure as claimed in claim 17, wherein said third metal layer comprises a copper layer and a nickel layer over said copper layer.

19. A chip structure comprising:
a silicon substrate;
a resistor in said silicon substrate, wherein said resistor comprises silicon with a dopant;
a MOS device comprising a portion in said silicon substrate;
a metallization structure over said silicon substrate, wherein said metallization structure comprises a first metal layer and a second metal layer over said first metal layer;
a dielectric layer between said first and second metal layers;
a nitride layer over said metallization structure and said dielectric layer, wherein a first opening in said nitride layer is over a first contact point of a first metal interconnect of said metallization structure, and said first contact point is at a bottom of said first opening, and wherein a second opening in said nitride layer is over a second contact point of a second metal interconnect of said metallization structure, and said second contact point is at a bottom of said second opening, wherein said first contact point is connected to said second contact point through said resistor, wherein said nitride layer has a thickness greater than 0.35 micrometers; and
a third metal layer over said nitride layer and on said first and second contact points, wherein said third metal layer comprises a first portion connected to a second portion of said third metal layer through, in sequence, said first contact point, said resistor and said second contact point, wherein said third metal layer comprises a copper layer.

20. The chip structure as claimed in claim 19, wherein said dopant comprises boron.

21. The chip structure as claimed in claim 19, wherein said dopant comprises phosphorous.

22. The chip structure as claimed in claim 19, wherein said dopant comprises arsenic.

23. The chip structure as claimed in claim 19, wherein said dopant comprises gallium.

24. The chip structure as claimed in claim 19 further comprising a polymer layer on said nitride layer, wherein said third metal layer is further on said polymer layer.

25. The chip structure as claimed in claim 24, wherein said polymer layer comprises polyimide (PI).

26. The chip structure as claimed in claim 24, wherein said polymer layer comprises benzocyclobutene (BCB).

27. The chip structure as claimed in claim 19, wherein said third metal layer further comprises a titanium-containing layer under said copper layer.

28. The chip structure as claimed in claim 19, wherein said nitride layer comprises silicon nitride.

29. The chip structure as claimed in claim 19 further comprising a polymer layer on said third metal layer and over said nitride layer.

30. The chip structure as claimed in claim 29, wherein said polymer layer comprises polyimide (PI).

31. The chip structure as claimed in claim 29, wherein said polymer layer comprises benzocyclobutene (BCB).

32. A chip structure comprising:
a silicon substrate;
a resistor in said silicon substrate, wherein said resistor comprises silicon with a dopant;
a MOS device comprising a portion in said silicon substrate;
a metallization structure over said silicon substrate, wherein said metallization structure comprises a first metal layer and a second metal layer over said first metal layer;
a dielectric layer between said first and second metal layers;
a separating layer over said metallization structure and said dielectric layer, wherein a first opening in said separating layer is over a first contact point of a first metal interconnect of said metallization structure, and said first contact point is at a bottom of said first opening, and wherein a second opening in said separating layer is over a second contact point of a second metal interconnect of said metallization structure, and said second contact point is at a bottom of said second opening, wherein said first contact point is connected to said second contact point through said resistor, wherein said separating layer comprises a nitride layer;
a third metal layer over said separating layer and on said first and second contact points, wherein said third metal layer comprises a first portion connected to a second portion of said third metal layer through, in sequence, said first contact point, said resistor and said second contact point, wherein said third metal layer comprises a copper layer; and
a first polymer layer covering a top surface and sidewall of said first portion of said third metal layer.

33. The chip structure as claimed in claim 32, wherein said dopant comprises boron.

34. The chip structure as claimed in claim 32, wherein said dopant comprises phosphorous.

35. The chip structure as claimed in claim 32, wherein said dopant comprises arsenic.

36. The chip structure as claimed in claim 32, wherein said dopant comprises gallium.

37. The chip structure as claimed in claim 32, wherein said third metal layer further comprises a titanium-containing layer under said copper layer.

38. The chip structure as claimed in claim 32, wherein said first polymer layer comprises polyimide (PI).

39. The chip structure as claimed in claim 32, wherein said first polymer layer comprises benzocyclobutene (BCB).

40. The chip structure as claimed in claim 32, wherein said third metal layer further comprises a nickel layer over said copper layer.

41. The chip structure as claimed in claim 32, wherein said third metal layer further comprises a gold layer over said copper layer.

42. The chip structure as claimed in claim 32, wherein said third metal layer further comprises a nickel layer over said copper layer, and a gold layer over said nickel layer.

43. The chip structure as claimed in claim 32 further comprising a second polymer layer on said separating layer, wherein said third metal layer is further on said second polymer layer.

44. The chip structure as claimed in claim 43, wherein said second polymer layer comprises polyimide (PI).

45. The chip structure as claimed in claim 43, wherein said second polymer layer comprises benzocyclobutene (BCB).

46. A chip structure comprising:
a substrate;
a capacitor over said substrate, wherein said capacitor comprises a first electrode over said substrate, a second electrode over said substrate and a dielectric material between said first and second electrodes, wherein said first electrode comprises damascene copper;
a first metal interconnect over said substrate, wherein said first metal interconnect comprises damascene copper;
a second metal interconnect over said substrate, wherein said second metal interconnect comprises damascene copper, wherein said second metal interconnect comprises a portion spaced apart from said first metal interconnect;
a separating layer over said substrate, wherein a first opening in said separating layer is over a first contact point of said first metal interconnect, and said first contact point is at a bottom of said first opening, and wherein a second opening in said separating layer is over a second contact point of said second metal interconnect, and said second contact point is at a bottom of said second opening;
a third metal interconnect over said separating layer and on said first and second contact points, wherein said third metal interconnect comprises aluminum, wherein said first contact point is connected to said second contact point through said third metal interconnect; and
an insulating layer over said third metal interconnect, said separating layer and said capacitor.

47. The chip structure of claim 46, wherein said substrate comprises silicon.

48. The chip structure of claim 46, wherein said separating layer comprises a nitride layer.

49. The chip structure of claim 46, wherein said separating layer comprises an oxide layer.

50. The chip structure of claim 46, wherein said separating layer comprises an oxynitride layer.

51. The chip structure of claim 46, wherein said dielectric material comprises an oxide.

52. The chip structure of claim 46, wherein said dielectric material comprises a nitride.

53. The chip structure of claim 46, wherein said dielectric material comprises an oxynitride.

54. The chip structure of claim 46, wherein said dielectric material comprises tantalum oxide.

55. The chip structure of claim 46 further comprising a resistor in said substrate.

56. The chip structure of claim 46, wherein said insulating layer comprises a polymer layer.

57. The chip structure of claim 46, wherein said insulating layer contacts a top surface of said third metal interconnect and a sidewall of said third metal interconnect.

58. The chip structure of claim 46 further comprising a polymer layer on said separating layer, wherein said third metal interconnect is further on said polymer layer.

59. The chip structure of claim 46, wherein said second electrode comprises a copper layer.

60. The chip structure of claim 46, wherein said first opening has a width between 0.1 and 20 micrometers.

61. The chip structure of claim 46, wherein said second electrode is over said first electrode.

62. The chip structure of claim 46 further comprising an inductor over said separating layer.

63. The chip structure of claim 62, wherein said inductor comprises aluminum.

* * * * *